(12) United States Patent
Lee et al.

(10) Patent No.: US 7,294,863 B2
(45) Date of Patent: Nov. 13, 2007

(54) MICRO-LENS BUILT-IN VERTICAL CAVITY SURFACE EMITTING LASER

(75) Inventors: Jeong-kwan Lee, Gyeonggi-do (KR); Jae-hoon Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 127 days.

(21) Appl. No.: 09/982,086

(22) Filed: Oct. 19, 2001

(65) Prior Publication Data
US 2002/0093024 A1    Jul. 18, 2002

(30) Foreign Application Priority Data
Oct. 20, 2000    (KR)    ................ 2000-61983

(51) Int. Cl.
H01L 33/00    (2006.01)
H01S 3/08    (2006.01)
H01S 5/00    (2006.01)
H01S 3/10    (2006.01)

(52) U.S. Cl. ............... 257/98; 372/99; 372/101; 372/50.1; 372/49.01; 372/46.01; 372/96; 372/24

(58) Field of Classification Search .......... 257/98; 372/49, 50, 201, 96, 99, 101, 46, 108, 50.124, 372/124
See application file for complete search history.

(56) References Cited

U.S. PATENT DOCUMENTS 5,084,895 A * 1/1992 Shimada et al. ........... 372/108
5,386,105 A    1/1995 Quinn et al.
5,461,637 A * 10/1995 Mooradian et al. .......... 372/11
5,500,540 A * 3/1996 Jewell et al. ............... 257/432
5,506,451 A * 4/1996 Hyugaji .................... 257/448
5,966,399 A    10/1999 Jiang et al.
5,981,945 A * 11/1999 Spaeth et al. ............... 250/216

(Continued)

FOREIGN PATENT DOCUMENTS

EP    1 035 423 A2    9/2000

(Continued)

OTHER PUBLICATIONS

Notice to Submit Response, Korean Industrial Property Office, Jun. 28, 2002.
Strzelecka, et al., "Monolithic Integration of Vertical-cavity Laser Diodes with Refractive GaAs Microlenses", Electronics Letters, IEE Stevenage, GB, vol. 31, No. 9, Apr. 27, 1995, pp. 724-725.

(Continued)

Primary Examiner—Sara Crane
Assistant Examiner—Samuel A. Gebremariam
(74) Attorney, Agent, or Firm—Stein, McEwen & Bui, LLP

(57) ABSTRACT

A micro-lens built-in vertical cavity surface emitting laser (VCSEL) includes a substrate and a lower reflector formed on the substrate. An active layer is formed on the lower reflector, generating light by a recombination of electrons and holes. An upper reflector is formed on the active layer including a lower reflectivity than that of the lower reflector. A micro-lens is disposed in a window region through which the laser beam is emitted. A lens layer is formed on the upper reflector with a transparent material transmitting a laser beam; the lens layer includes the micro-lens. An upper electrode is formed above the upper reflector excluding the window region a lower electrode formed underneath the substrate.

59 Claims, 5 Drawing Sheets

U.S. PATENT DOCUMENTS

| | | | |
|---|---|---|---|
| 6,051,848 A | * | 4/2000 | Webb .......................... 257/99 |
| 6,091,537 A | * | 7/2000 | Sun et al. ................... 359/248 |
| 6,122,109 A | | 9/2000 | Peake et al. |
| 6,253,004 B1 | * | 6/2001 | Lee et al. .................... 385/31 |

FOREIGN PATENT DOCUMENTS

| | | |
|---|---|---|
| EP | 1 045 330 A2 | 10/2000 |
| EP | 1 045 330 A3 | 10/2000 |
| JP | 57-027097 | 2/1982 |
| JP | 08-255933 | 10/1996 |
| JP | 09-072759 | 3/1997 |
| JP | 09-162483 | 6/1997 |
| JP | 10-056233 | 2/1998 |
| JP | 10-335737 | 12/1998 |

OTHER PUBLICATIONS

Eugene Hecht, "Optics, second edition" 1987, Addison & Wesley Publ. Company, Reading Massachusetts, USA XP002235961, pp. 134-135.

European Search Report dated Jun. 27, 2005, issued in corresponding European Patent Application No. 05009013.3.

E. M. Strzelecka et al., "Monolithic Integration of vertical-cavity laser diodes with refractive GaAs microlenses" Electronics Letters, IEE Stevenage, GB, vol. 31 No. 9, Apr. 27, 1995, pp. 724-725.

E. Hecht, "Optics", second edition 1987, Addison & Wesley Publ. Company, Reading Massachusetts, USA XPOO2235961, Chapter 5, pp. 134-135 and XP002235962, Chapter 10, pp. 416-421.

H. Miyajima et al., "Optical micro encoder using vertical-cavity surface-emitting laser", Sensors and Actuators A., Elsevier Sequoia S.A., Lausanne, CH, vol. 57, No. 2, Nov. 1, 1996, pp. 127-135.

\* cited by examiner

MICRO-LENS BUILT-IN VERTICAL CAVITY SURFACE EMITTING LASER

CROSS-REFERENCE TO RELATED APPLICATIONS

This application claims the benefit of Korean Application No. 2000-61983, filed Oct. 20, 2000, in the Korean Industrial Property Office, the disclosure of which is incorporated herein by reference.

BACKGROUND OF THE INVENTION

1. Field of the Invention

The present invention relates to a micro-lens built-in vertical cavity surface emitting laser (VCSEL) in which a micro-lens is formed on a laser beam emitting surface of the VCSEL, and more particularly, to a micro-lens built-in VCSEL capable of emitting a parallel light beam.

2. Description of the Related Art

In general, VCSELs emit a light beam in a direction of a semiconductor material layer stack, and thus it is easy to optically combine VCSELs with another optical element and to assemble the VCSELs into an apparatus. In addition, the VCSELs can also be manufactured to have a two-dimensional array structure. Thus, the VCSELs can be widely applied as light sources in optical transmission systems for applications such as optical communications or interfacing using optical signals, and in optical recording/reproducing optical heads.

Referring to FIG. 1, a conventional VCSEL includes a substrate 10, a lower reflector 11, an active layer 12, a high-resistance region 13 and an upper reflector 14 which are sequentially stacked on the substrate 10, an upper electrode 16 formed on a portion of the upper reflector 14 excluding a window 18 through which a laser beam is emitted, and a lower electrode 17 formed underneath the substrate 10.

Each of the lower reflector 11 and the upper reflector 14 is a distributed Bragg reflector (DBR) which is formed by alternately stacking semiconductor material layers having different refractive indexes, and having an opposite doping type. That is, the substrate 10 and the lower reflector 11 are doped with the same n-type impurities and the upper reflector 14 is doped with p-type impurities.

The high-resistance region 13 guides the flow of current passed through the upper and lower electrodes 16 and 17 into a center of the active layer 12. The active layer 12 is a region where light is generated by a combination of holes and electrons from the upper and lower reflectors 14 and 11, where the combination of holes and electrons is induced by a current applied across the upper and lower electrodes 16 and 17. Light generated in the active layer 12 is reflected repeatedly between the upper and lower reflectors 14 and 11 and only a light having a wavelength in accordance with the resonance condition remains, and is emitted through the window 18.

In the conventional VCSEL having the aforementioned structure, the laser beam emitted through the window 18 has a predetermined radiation angle. Thus, when such a conventional VCSEL is adopted as a light source, for example, for an optical transmission system using an optical cable, a condensing lens for condensing a divergent laser beam emitted from the VCSEL is required between the VCSEL and an input terminal of the optical cable, so as to efficiently couple the laser beam emitted from the VCSEL to the optical cable.

As another example, when the above-mentioned conventional VCSEL is adopted as the light source for an optical head in an optical recording/reproduction apparatus which records information on or reproduces information from a recording medium such as an optical disc in a non-contact manner, the optical head needs a collimating lens for condensing a divergent laser beam emitted from the conventional VCSEL into a parallel laser beam.

Briefly, because the conventional VCSEL emits the divergent laser beam through the window 18, a separate condensing lens or collimating lens is needed at the light emitting side of the VCSEL so as to construct an optical system with the VCSEL. Thus, when constructing an optical system, a number of parts required increases and there is a need to align the lens with a central optical axis of the laser beam emitted from the VCSEL, making an optical alignment structure complicated.

SUMMARY OF THE INVENTION

Various objects and advantages of the invention will be set forth in part in the description that follows and, in part, will be obvious from the description, or may be learned by practice of the invention.

To solve the above-described problems, it is an object of the present invention to provide an optical system including a micro-lens built-in vertical cavity surface emitting laser (VCSEL) emitting a parallel laser beam, without including a separate condensing or a collimating lens.

To achieve the above and other objects of the present invention, there is provided a micro-lens built-in vertical cavity surface emitting laser (VCSEL) including: a substrate; a lower reflector formed on the substrate; an active layer formed on the lower reflector, generating light by a recombination of electrons and holes; an upper reflector formed on the active layer including a lower reflectivity than that of the lower reflector; a micro-lens disposed in a window region through which the laser beam is emitted; a lens layer formed on the upper reflector with a transparent material transmitting a laser beam, the lens layer including the micro-lens; an upper electrode formed above the upper reflector excluding the window region; and a lower electrode formed underneath the substrate. The VCSEL satisfies a following relationship:

$$f = R \times n1/(n2 - n1)$$

where f is a distance along an optical axis from a light generating region of the active layer to a vertex of the micro-lens, R is a radius of curvature of the micro-lens, n1 is an effective refractive index of a medium on an optical path between the light generating region and the lens layer, and n2 is a refractive index of a region towards which a light is emitted through the micro-lens.

In an embodiment of the present invention, a micro-lens built-in vertical cavity surface emitting laser (VCSEL) includes: a substrate; a lower reflector formed on the substrate; an active layer formed on the lower reflector generating light by a recombination of electrons and holes; an upper reflector formed on the active layer including a lower reflectivity than that of the lower reflector; a micro-lens disposed in a window region through which the laser beam is emitted; a lens layer formed on the upper reflector with a transparent material transmitting a laser beam, the lens layer including the micro-lens; an upper electrode formed above the upper reflector excluding the window region; and a lower electrode formed underneath the substrate, wherein the window region includes a maximum width smaller than a size of light generated in the active layer emitted towards the window region, satisfying a Fraunhofer diffraction condition, where the Fraunhofer diffraction condition occurring in the window region is offset by a focusing power of the micro-lens. The maximum width of the window region D and a focal length f of the micro-lens satisfy a relation:

$$D = \sqrt{2 \times 1.22 \lambda f}$$

where λ is a wavelength of the laser beam emitted from the VCSEL.

In another embodiment of the present invention, there is provided a micro-lens built-in vertical cavity surface emitting laser (VCSEL) including: a micro-lens disposed in a window region through which a laser beam is emitted; a substrate including a transparent material transmitting the laser beam, the substrate including the micro-lens; a lower reflector formed on the substrate; an active layer formed on the lower reflector, generating light by recombination of electrons and holes; an upper reflector formed on the active layer including a higher reflectivity than that of the lower reflector; an upper electrode formed on the upper reflector; and a lower electrode formed on a portion of the substrate excluding the window region through which the laser beam is emitted. The VCSEL satisfies a following relationship:

$$f = R \times n1/(n2-n1)$$

where f is a distance along an optical axis from a light generating region of the active layer to a vertex of the micro-lens, R is a radius of curvature of the micro-lens, n1 is an effective refractive index of a medium on an optical path between the light generating region and the lens layer, and n2 is a refractive index of a region towards which a light is emitted through the micro-lens.

In still another embodiment of the present invention, there is provided a micro-lens built-in vertical cavity surface emitting laser (VCSEL) including: a micro-lens disposed in a window region through which a laser beam is emitted; a substrate including a transparent material transmitting the laser beam, the substrate including the micro-lens; a lower reflector formed on the substrate; an active layer formed on the lower reflector, generating light by recombination of electrons and holes; an upper reflector formed on the active layer including a higher reflectivity than that of the lower reflector; an upper electrode formed on the upper reflector; and a lower electrode formed on a portion of the substrate excluding the window region through which the laser beam is emitted, wherein the window region includes a maximum width smaller than a size of the light generated in the active layer and emitted towards the window region, satisfying a Fraunhofer diffraction condition, where the Fraunhofer diffraction condition occurring in the window region is offset by a focusing power of the micro-lens. The maximum width of the window region D and a focal length f of the micro-lens satisfy a relation:

$$D = \sqrt{2 \times 1.22 \lambda f}$$

where λ is a wavelength of the laser beam emitted from the VCSEL.

The present invention further provides for a micro-lens built-in vertical cavity surface emitting laser (VCSEL), including a micro-lens integrally formed on a laser beam emitting surface of the VCSEL emitting a parallel light beam.

These together with other objects and advantages, which will be subsequently apparent, reside in the details of construction and operation as more fully hereinafter described and claimed, reference being had to the accompanying drawings forming a part thereof, wherein like numerals refer to like parts throughout.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE PREFERRED EMBODIMENTS

Figure 1:
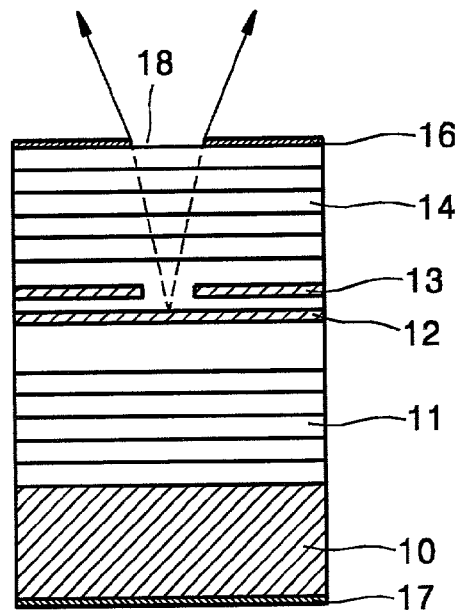
FIG. 1 shows an example of a conventional vertical cavity surface emitting laser (VCSEL)
Figure 2:
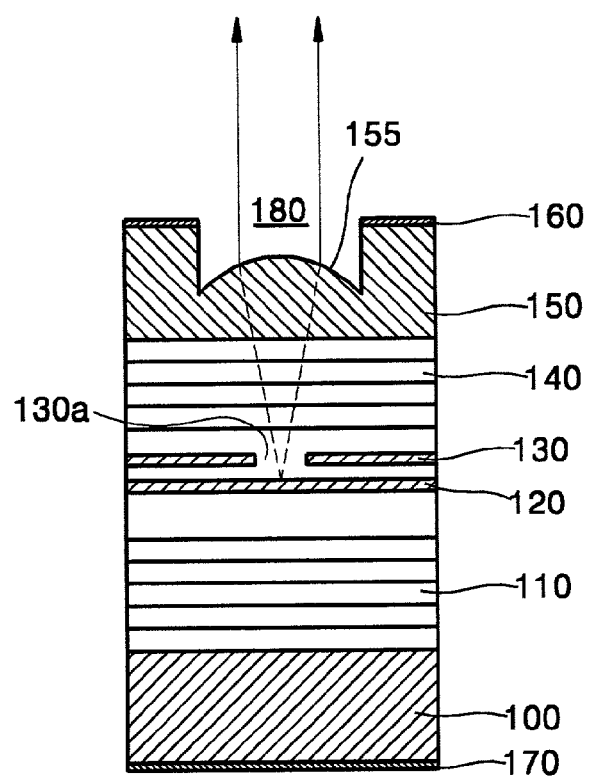
FIG. 2 shows a first embodiment of a micro-lens built-in VCSEL according to the present invention.

A first embodiment of a micro-lens built-in vertical cavity surface emitting laser (VCSEL) according to the present invention is shown in FIG. 2. Referring to FIG. 2, the micro-lens built-in VCSEL according to the first embodiment of the present invention includes a substrate 100, a lower electrode 170 formed underneath the substrate 100, a lower reflector 110, an active layer 120, and an upper reflector 140 which are sequentially stacked on the substrate 100, a lens layer 150 formed on the upper reflector 140, and an upper electrode 160 formed on a portion of the lens layer 150 excluding a window region 180 through which a laser beam is emitted.

The substrate 100 may be formed of a semiconductor material, for example, n-doped gallium arsenide (GaAs), aluminum gallium arsenide (AlGaAs), indium arsenide (InAs), indium phosphide (InP), gallium phosphide (GaP), indium gallium phosphide (InGaP), indium gallium arsenide (InGaAs), or gallium phosphide (GaP). Each of the lower reflector 110 and the upper reflector 140 is formed of alternating semiconductor compounds having different refractive indexes. For example, the upper and lower reflectors 140 and 110 are formed by alternately stacking AlGaAs layers having different refractive indexes.

For the structure as shown in FIG. 2 in which most of the generated laser beam is emitted through the upper reflector 140, the upper reflector 140 is formed to have a relatively lower reflectivity and the lower reflector 110 is formed to have a higher reflectivity than the upper reflector 140. The reflectivity of the lower and upper reflectors 110 and 140 varies depending on a number of semiconductor compound layers deposited to form the same. Accordingly, by forming the upper reflector 140 with less material layers than used to form the lower reflector 110, the reflectivity of the upper reflector 140 is lower than that of the lower reflector 110. Here, if the substrate 100 is doped with n-type impurities, the lower reflector 110 may be doped with the same n-type impurities but the upper reflector 140 is doped with p-type impurities.

The current applied across the upper and lower electrodes 160 and 170 induces a flow of electrons and holes, and the upper and lower reflectors 140 and 110 reflect repeatedly light generated in the active layer 120 such that only light in accordance with the resonance condition is emitted through the upper reflector 140. The active layer 120, a region where light is generated by energy transition due to a recombination of holes and electrons provided from the upper and lower reflectors 140 and 110, has a single or multiple quantum-well structure or super lattice structure. The active layer 120 may be formed of, for example, GaAs, AlGaAs, InGaAs, InGaP and/or AlGaAsP according to a wavelength of a required output laser beam.

Meanwhile, a high-resistance region 130 to guide a flow of current is further formed in a region of the upper reflector 140. The high-resistance region 130 has an aperture 130a at a center thereof through which the current applied through the upper electrode 160 flows. In the alternative, the high-resistance region 130 may be formed in a region of the lower reflector 140.

The high-resistance region 130 may be formed by implantation of ions such as protons, or by selective oxidation. In the selective oxidation method, a pre-oxidative layer (not shown) is deposited in the middle of the upper reflector 140 and exposed in an oxidation atmosphere to form an insulating oxide layer as the high-resistance region, which is oxidized from an exposed portion of the pre-oxidative layer. For illustrative purposes, the high-resistance region 130 is formed by oxidation, which allows easy control of a size of the aperture 130a, so that the high-resistance region 130 has better light beam guiding characteristics. In the present embodiment, for example, the aperture 130a is formed as small as possible such that the current applied through the upper electrode 160 passes a region as small as possible on the active layer 120 and light is generated in the small region (for instance, in a dot-sized region) of the active layer.

As described above, when the VCSEL, according to the first embodiment of the present invention, is designed such that the light is generated in a region as small as possible on the active layer 120, the light generating region may be ideally a dot-sized region. In this case, the light going toward the lens layer 150 from the light generating region is approximately diverging light originating from the dot-sized light generating region.

The lens layer 150 has a predetermined thickness, for example, of several micrometers and may be deposited on the upper reflector 140. For instance, the lens layer 150 is formed of a material having a relatively wide bandgap to the wavelength of the laser beam generated from the VCSEL, so as not to absorb, but transmit and emit the laser beam through the upper reflector 140. In addition, when the lens layer 150 is formed directly on the upper reflector 140, the lens layer 150 may be formed of a material capable of lattice matching with the material of the upper reflector 140.

For example, if the VCSEL is designed to emit a laser beam having a wavelength between 500 nm and 900 nm, the lens layer 150 may be formed of InGaP. Here, a composition ratio of In and Ga may be varied according to the wavelength of the desired output laser beam, which has a wavelength of, for example, 850 nm, 780 nm, or 660 nm. Alternatively, if the VCSEL is designed to emit a laser beam having a wavelength of about 980 nm, the lens layer 150 is formed of GaAs. In addition, according to the wavelength of the output laser beam from the VCSEL, the lens layer 150 may be formed of at least one material selected from silicon and a III–V compound semiconductor including InP, GaAs, InAs, GaP, InGaP, and InGaAs.

A micro-lens 155 is integrally formed on the window region 180 of the lens layer 150 through which the laser beam is emitted. While passing through the lens layer 150, the laser beam is condensed by the micro-lens 155 and emitted.

The micro-lens 155 is formed by diffusion-limited etching. In particular, an etch mask (not shown) having an opening is formed on the lens layer 150 and immersed in a chemical etching solution containing an appropriate concentration of etchant, such as bromine ($Br_2$), for inducing diffusion-limited etching with respect to a material of the lens layer 150, for a predetermined period of time. As a result, a portion of the lens layer 150 which is exposed through the opening of the etch mask is etched by a difference in spatial etching rate of the lens layer 150 caused by diffusion of the etchant, for example, $Br_2$, contained in the chemical etching solution, thereby resulting in the micro-lens 155 having a convex surface.

A method of manufacturing the micro-lens 155 according to the present invention by diffusion-limited etching is disclosed in U.S. patent application Ser. No. 09/504,912 (Feb. 16, 2000) filed by the present applicant, entitled "Micro-lens, Combination Micro-lens and VCSEL, and Methods for Manufacturing the Same." Thus, a detailed description of the manufacturing method is incorporated herein by reference.

The upper electrode 160 may be formed on the lens layer 150 or between the upper reflector 140 and the lens layer 150. FIG. 2 illustrates an example where the upper electrode 160 is formed on the lens layer 150. In this instance, the lower electrode 170 is formed underneath the substrate 100.

Further, the window 180 of the VCSEL according to the first embodiment of the present invention, has a maximum width greater than the aperture 130a of the high-resistance region 130. As shown in FIG. 2, the upper electrode 160 and the micro-lens 155 define the width of the window 180.

In the VCSEL according to the first embodiment of the present invention, for illustrative purposes, a distance along an optical axis from the light generating region of the active layer 120 to a vertex of the micro-lens 155 is approximately equal to a focal length of the micro-lens 155. That is, if f is a distance along the optical axis from the light generating region of the active layer 120 to the vertex of the micro-lens 155, R is a radius of curvature of the micro-lens 155, n1 is an effective refractive index of a medium on the optical path between the light generating region and the lens layer 150, i.e., of the upper reflector 140 and the lens layer 150, and n2 is a refractive index of a region toward which the laser beam is emitted through the micro-lens 155, i.e., the air. Thus, the VCSEL, according to the first embodiment of the present invention, is manufactured to satisfy a formula (1):

$$f = R \times n1/(n2-n1) \tag{1}$$

Accordingly, the micro-lens 155 is formed as an approximately plano-convex lens having a focal point in the light generating region of the active layer 120, and thus an approximately parallel laser beam is emitted from the VCSEL, according to the first embodiment of the present invention.

In the VCSEL, according to the first embodiment of the present invention having the configuration as described above, as a forward biased current is applied to the VCSEL through the upper and lower electrodes 160 and 170, the applied current is guided into the narrow center region of the active layer 120 by the high-resistance region 130, and the electrons and holes from the upper and lower reflectors 140 and 110 are recombined in a narrow center region to generate light. The generated light is reflected repeatedly between the upper and lower reflectors 140 and 110 and thus, only light having a particular wavelength (a laser beam consequently to be emitted) in accordance with the resonance condition remains, and is amplified and transmitted through the upper reflector 140. The transmitted laser beam, as a divergent beam, is condensed by the micro-lens 155 while passing the lens layer 150, so that a parallel laser beam is emitted.

In view of the characteristic of the VCSEL, in accordance with the present invention, the parallel laser beam emitted from the VCSEL has a size of about several to tens of micrometers, for example, a size of 15 micrometers. Thus, when the VCSEL according to the present invention is adopted in an optical communication system employing an optical fiber, an optical coupling between the VCSEL and the optical fiber can be sufficiently realized. Thus, there is no need for a separate ball lens (not shown) for optical coupling between the light source and the optical fiber. That is, a single mode optical fiber has a minimum core diameter of 10 micrometers and a multiple mode optical fiber has a minimum core diameter of tens of micrometers, for example, 62.5 micrometers. Because the VCSEL, according to the present invention, emits a parallel laser beam of about 15 micrometers, the parallel laser beam emitted from the VCSEL can be coupled with the optical fiber with high efficiency without need for a separate optical coupling lens.

When the VCSEL, according to the present invention, is applied to an optical system such as an optical head that uses a parallel light beam, there is an advantage that no collimating lens is required, unlike the conventional VCSEL. In addition, when the VCSEL, according to the present invention, is adopted to transmit and receive an optical signal through free space, no separate condensing lens is needed and the degree of freedom of the distance between light transmitting and receiving portions increases. Thus, the optical structure is simple and optical alignment is easy. Furthermore, the VCSEL and/or a light detecting element can be arranged in arrays with compactness.

Figure 3:
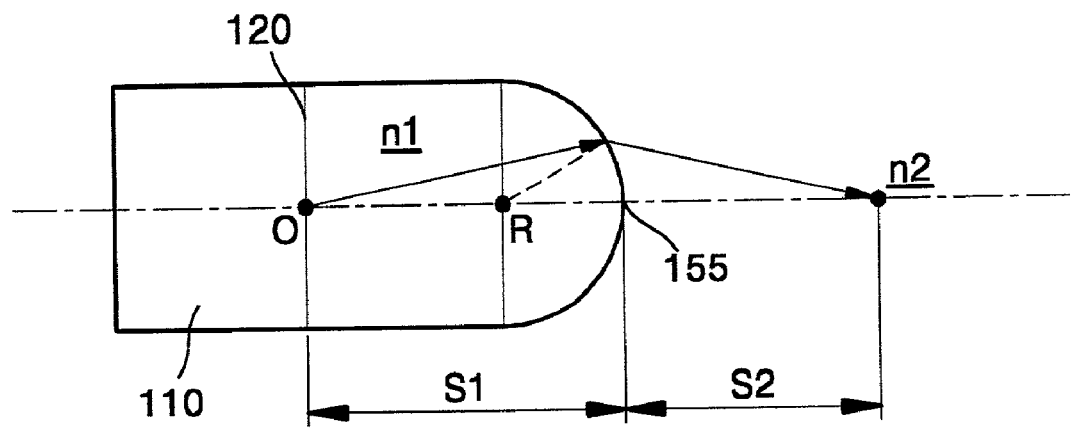
FIGS. 3 and 4 show geometrical optics of the first embodiment of the micro-lens built-in VCSEL, according to the present invention, illustrating a principle of approximately parallel laser beam emission from the VCSEL.
Figure 4:
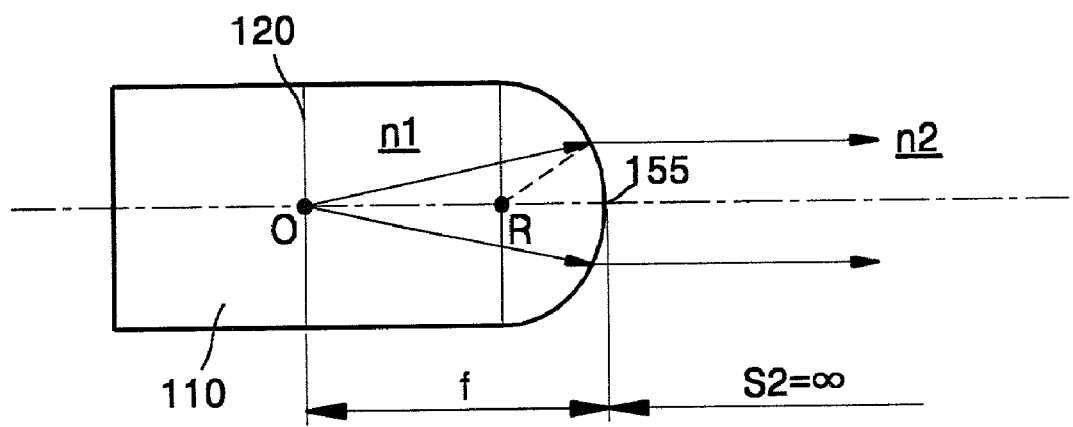

The principle of parallel laser beam emission from the VCSEL according to the first embodiment of the present invention, which satisfies formula (1) above will now be described with reference to FIGS. 3 and 4. FIGS. 3 and 4 show geometrical optics of the structure of the VCSEL, according to the first embodiment of the present invention. Referring to FIG. 3, assuming that S1 is a distance from the light generating region of the active layer 120, i.e., a first focal point O, to a vertex of the micro-lens 155 on the optical axis, S2 is a distance from the vertex of the micro-lens 155 to a second focal point of the micro-lens 155, n1 is an effective refractive index of a medium ranging from the light generating region to the lens layer 150, i.e., of the upper reflector 140 and the lens layer 150, and n2 is a refractive index of a region toward which the light beam emitted through the micro-lens 155 travels, i.e., of the air, the structure of the VCSEL according to the first embodiment of the present invention of FIG. 3 satisfies a formula (2):

$$n1/S1 + n2/S2 = (n2-n1)/R \quad (2)$$

Here, n2, the refractive index of the air, is about 1.0. In order for the micro-lens 155 to condense a divergent light beam generated in the active layer 120 into a parallel light beam, as shown in FIG. 4, distance S2 should be infinite. Thus, if S2 is set as infinity and S1 is replaced by f in formula (2), a first focal length f for infinite S2 becomes the same as that expressed as formula (1) above. The VCSEL, according to the first embodiment of the present invention, which satisfies formula (1) can emit an approximately parallel laser beam.

Figure 5:
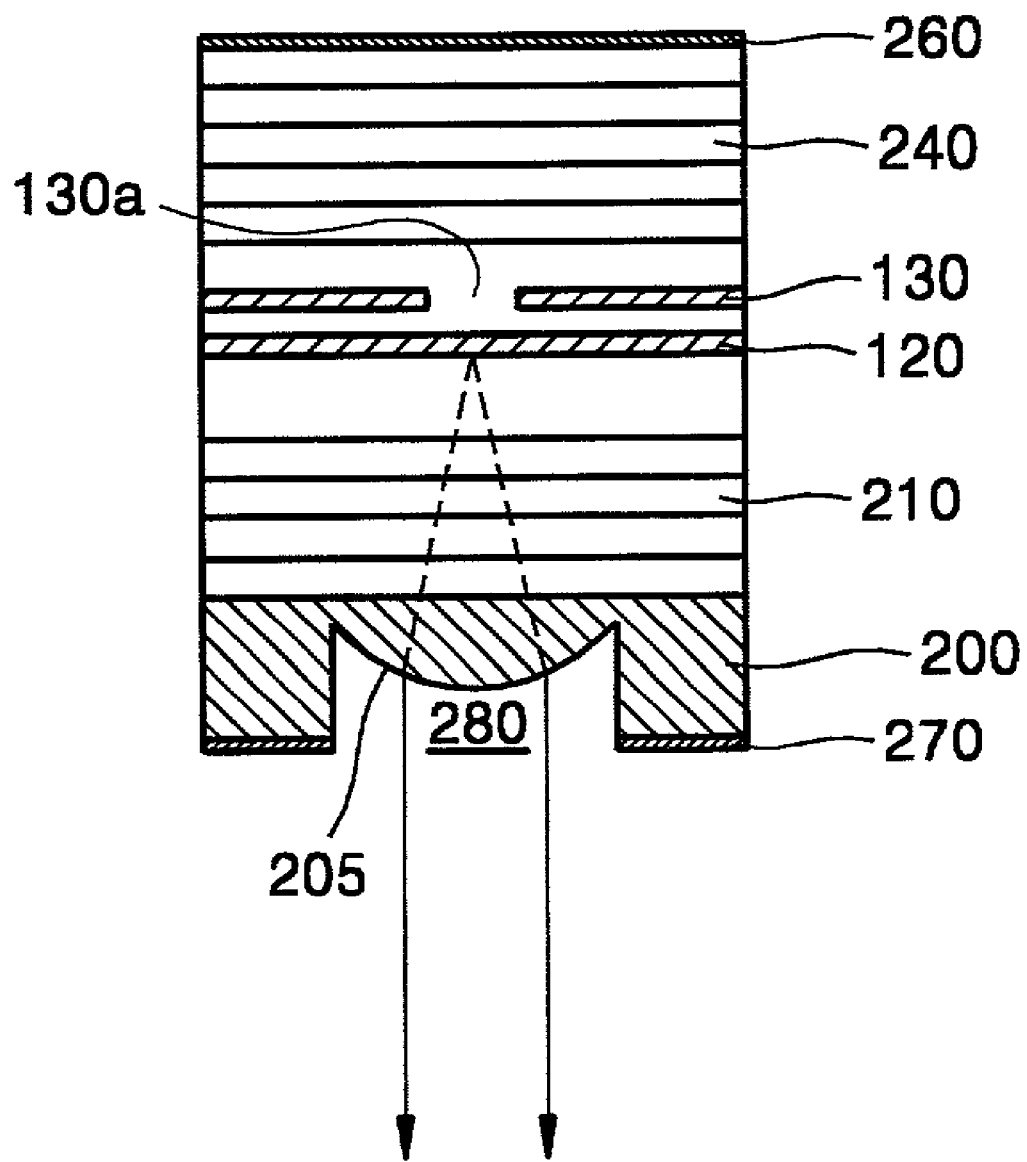
FIG. 5 shows a second embodiment of the micro-lens built-in VCSEL according to the present invention.

FIG. 5 shows a second embodiment of the micro-lens built-in VCSEL according to the present invention. The VCSEL of FIG. 5 is designed to emit a parallel laser beam based on the same principle as applied to the VCSEL according to the first embodiment of the present invention described above. The VCSEL of FIG. 5 differs from the VCSEL according to the first embodiment in that it is a bottom emitting type. In FIG. 5, the same reference numerals as those of FIG. 2 represent elements having the same functions as corresponding elements of FIG. 2, and thus descriptions thereof are not provided here.

Referring to FIG. 5, the micro-lens built-in VCSEL, according to the second embodiment of the present invention, includes a substrate 200, a lower reflector 210, an active layer 120, and an upper reflector 240 which are sequentially stacked on the substrate 200, an upper electrode 260 formed on the upper reflector 240, and a lower electrode 270 formed on a portion of the bottom of the substrate 200 excluding a window region 280 through which a laser beam is emitted. To emit a laser beam through the substrate 200, the lower reflector 210 is formed having a smaller reflectivity than the upper reflector 240.

When a number of stacked layers of the lower reflector 210 is smaller than that of the upper reflector 240, the reflectivity of the lower reflector 210 is lower than that of the upper reflector 240. Accordingly, most of the laser beam is emitted through the lower reflector 210. Except for a number of stacked layers of each of the upper and lower reflectors 240 and 210, materials used for and the stacked structures of the upper and lower reflectors 240 and 210 are substantially the same as those of the first embodiment of the VCSEL according to the present invention, and thus detailed descriptions thereof are not provided here.

Similar to the lens layer 150 (see FIG. 2) described in the first embodiment of the present invention, the substrate 200 may be formed of a material having a relatively wide bandgap to a wavelength of the laser beam generated from the VCSEL, so as not to absorb but transmit the laser beam incident from the lower reflector 210. For example, if the VCSEL is designed to emit a laser beam having a wavelength of 980 nm, the substrate 200 may be formed of GaAs. A micro-lens 205 is formed in the window region 280 of the substrate 200 through which the laser beam is emitted. Accordingly, the lower electrode 270 and the micro-lens 205 define the window region 280. The micro-lens 205 is formed by diffusion-limited etching as in the first embodiment of the present invention.

Assuming that R' is a radius of curvature of the micro-lens 205, n1' is an effective refractive index of the medium along the optical path between the light generating region of the active layer 120 and the micro-lens 205, i.e., of the lower reflector 210 and the substrate 200, and n2' is a refractive index of a region toward which the laser beam emits through the micro-lens 205, f is a distance from the light generating region to the vertex of the micro-lens 205 along the optical axis, like the VCSEL according to the first embodiment of the present invention, the VCSEL according to the second embodiment of the present invention is manufactured to satisfy the formula:

$$f' = R' \times n1'/(n2' - n1')$$

In the micro-lens built-in VCSEL, according to the second embodiment of the present invention, having the configuration above, as a forward biased current is applied to the micro-lens built-in VCSEL through the upper and lower electrodes 260 and 270, the laser beam having a particular wavelength through laser oscillation is transmitted through the lower reflector 210 and the substrate 200. The transmitted laser beam is condensed by the micro-lens 205 and emitted as an approximately parallel laser beam.

The micro-lens built-in VCSELs, according to the second embodiment of the present invention described above, are designed such that the first focal point of the micro-lens 155 (205) is positioned in the light generating region of the active layer 120, so that the light beam generated in a narrow light generating region, for instance a spot-sized region, is incident on and condensed by the micro-lens 155 (205), and is emitted as a parallel light beam.

Figure 6:
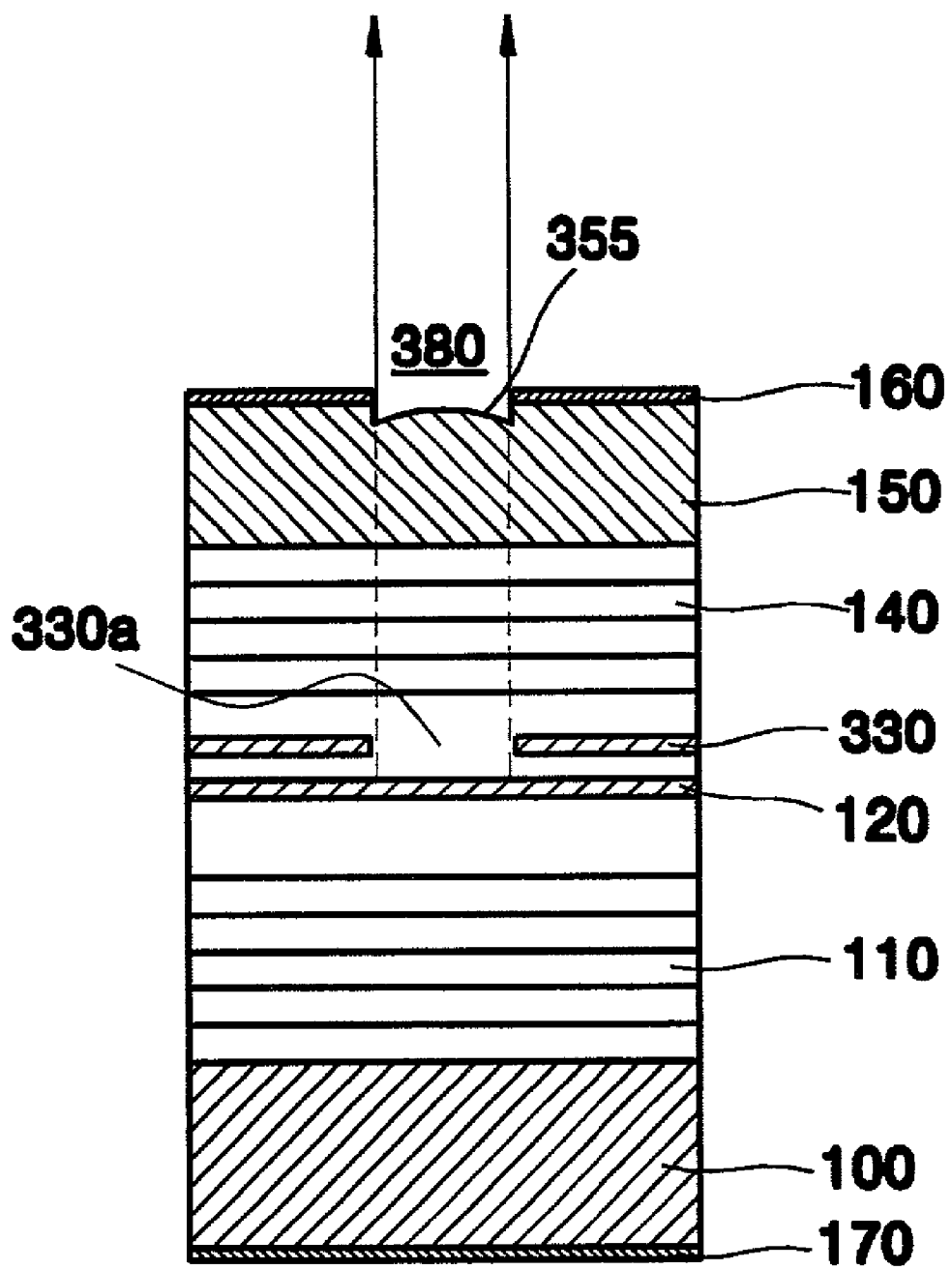
FIG. 6 shows a third embodiment of the micro-lens built-in VCSEL according to the present invention.

FIG. 6 shows a third embodiment of the micro-lens built-in VCSEL according to the present invention. In FIG. 6, the same reference numerals as those of FIG. 2 represent elements having the same functions as or similar functions to corresponding elements of FIG. 2; thus, descriptions of the elements are not provided here.

The micro-lens built-in VCSEL, according to the third embodiment of the present invention, includes a window 380 having a diameter (D) satisfying a Fraunhofer diffraction condition. Here, the Fraunhofer diffraction of the window 380 is offset by a focusing power of the micro-lens 355 such that a parallel laser beam is emitted through the micro-lens 355.

In this case, for instance, a relation between a diameter D of the window 380 and the focal length f of the micro-lens 355 satisfies formula (3):

$$D = \sqrt{2 \times 1.22 \lambda f} \quad (3)$$

where $\lambda$ is the wavelength of the laser beam emitted from the VCSEL according to the third embodiment of the present invention.

The diameter D of the window 380, for instance, is smaller than or approximately equal to a diameter of the aperture 330a of a high-resistance region 330. In the present embodiment, for instance, the aperture 330a of the high-resistance region 330 has a diameter greater than the aperture 130a of the first and second preferred embodiments according to the present invention.

In this case, light is generated in a wider region of the active layer 120 than the light generating region of the first and second embodiments of the present invention, and the generated light going toward the window 380 is almost parallel light, compared to the laser beams from the VCSELs of the first and second embodiments of the present invention. Thus, the Fraunhofer diffraction condition can be satisfactorily applied in the present embodiment.

Formula (3) above is obtained under an assumption that the window 380 and the micro-lens 355 are positioned on a same plane. Thus, if the window 380 and the micro-lens 355 are not positioned on the same plane, it is enough to correct the focal length f value with a distance between the window 380 and the micro-lens 355.

Figure 7:
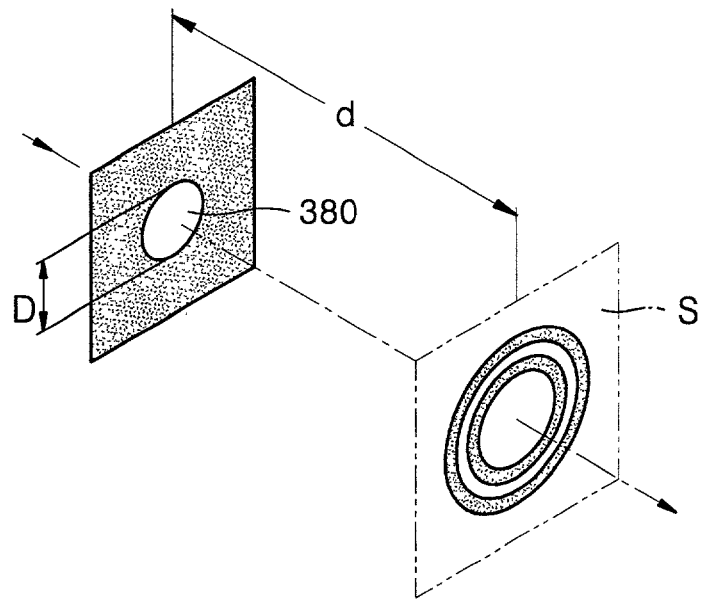
FIGS. 7 and 8 illustrate a principle of approximately parallel laser beam emission from the micro-lens built-in VCSEL according to the third embodiment of the present invention.

The principle of parallel laser beam emission from the third embodiment of the micro-lens built-in VCSEL according to the present invention will now be described. Referring to FIG. 7, the smaller the diameter D of the window 380, the greater the diffraction of the laser beam passing through the window 380. If the size of the window 380 is small enough and a distance d from the circular window 380 to an observing plane S is large enough, a Fresnel number $N_f$ satisfies formula (4), so that the Fraunhofer diffraction condition is satisfied:

$$N_f = \frac{D^2}{\lambda d} << 1 \quad (4)$$

Here, according to the present invention, an observing plane S is one focal point of the micro-lens 355.

The third embodiment of the VCSEL, according to the present invention, has the window 380 having the diameter D satisfying the Fraunhofer diffraction condition of $N_f << 1$. The Fraunhofer diffraction pattern formed by the laser beam passing through the window 380 becomes an Airy pattern. For these diffraction patterns of concentric circles, the $0^{th}$-order diffracted beam positioned at the center of the patterns viewed from an observing plane S has the greatest intensity, and a radius $R_s$ of the $0^{th}$-order diffracted beam is expressed as:

$$R_s = \frac{1.22 \lambda d}{D} \quad (5)$$

Figure 8:
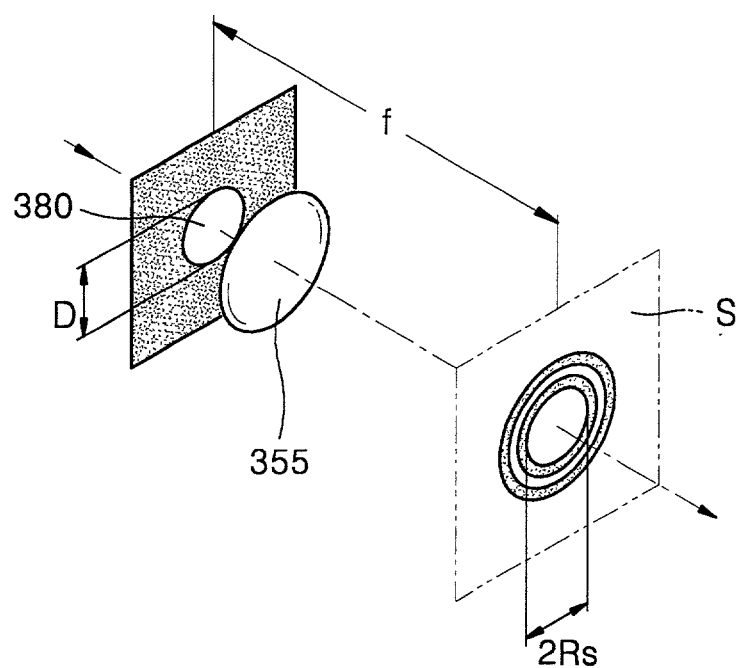

As shown in FIG. 8, in the VCSEL according to the third embodiment of the present invention, the micro-lens 355 may be positioned in front or behind the window 380. Alternatively, the micro-lens 355 and the window 380 may be positioned on a same plane. For easy understanding of the principle and for convenience of illustration, the micro-lens 355 is illustrated as being in front of the window 380 in FIG. 8.

If the micro-lens 355 and the window 380 are positioned on the same plane and only the $0^{th}$-order diffracted beam having a high intensity is considered. The radius $R_s$ of the beam at the observing plane S positioned at one focal point separated by the focal distance f of the micro-lens 355 from the window 380 is expressed as:

$$R_s = \frac{1.22 \lambda f}{D} \quad (6)$$

To emit a laser beam appearing to be parallel at the observing plane S, a diameter ($2R_s$) of the $0^{th}$-order diffracted beam at the observing plane S and the diameter D of the window 380 should be the same, i.e., $R_s = D/2$. Substituting the relation of $R_s = D/2$ into formula (6), the relation between the diameter D of the window 380 and the focal length f of the micro-lens 355 is established as expressed by formula (3) above.

As described in the present embodiment of the present invention, when the window 380 is formed having a size satisfying the Fraunhofer diffraction condition, the Fraunhofer diffraction occurring in the window 380 is offset by the focusing power of the micro-lens 355, so that a parallel laser beam can be emitted from the VCSEL. In particular, when the window 380 and the micro-lens 355 are formed to satisfy formula (3) above, the effect of emitting the parallel beam from the VCSEL according to the third embodiment of the present invention can be maximized.

Even when the VCSEL, according to the third embodiment of the present invention, has the window 380 and the micro-lens 355 which are not positioned on the same plane, formula (3) above can be applied to design the diameter D of the window 380 and the focal length f of the micro-lens 355. In this case, although a ratio of the parallel beam component with respect to the laser beam emitted from the VCSEL according to the third embodiment of the present invention slightly decreases compared to the two embodiments described above, if a degree of the reduction is allowable, the VCSEL can be applied to an optical system that needs a parallel beam. As described above, when the window 380 and the micro-lens 355 are not positioned on the same plane, the focal length f of formula (3) above is corrected by adding the distance between the window 380 and the micro-lens 355 to or substituting the same from the original focal length of the micro-lens 355.

When the VCSEL according to the third embodiment of the present invention described above, for example, emits a laser beam having a 850-nm wavelength and has a micro-lens having a 1-mm focal length, a parallel laser beam can be emitted from the VCSEL by forming the window having a diameter of 45.54 micrometers.

Although the window 355 is described and illustrated as a circular form having the diameter D, the shape of the window 355 may be varied. If the window 355 is formed as a non-circular form, D described as the diameter above corresponds to a maximum width of the non-circular window.

Although the VCSEL of FIG. 6 is illustrated as a top-emitting type VCSEL, corresponding to the VCSEL of FIG. 2, it will be appreciated that the principle of the third embodiment of the present invention can be applied to a bottom-emitting type VCSEL as shown in FIG. 5. A description and illustration of the bottom-emitting type VCSEL based on the principle of the third embodiment is not provided here.

The micro-lens built-in VCSELs, according to the present invention described above, emit an approximately parallel laser beam. Therefore, when the VCSELs, according to the present invention, are applied to an optical transmission system in the optical communications field using optical fiber or in the interface field using an optical signal, or to an optical system such as an optical head for a recording/reproduction apparatus, a separate condensing lens or collimating lens may be omitted. Thus, the optical alignment structure is simple, so that the optical system production cost is markedly reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A micro-lens built-in vertical cavity surface emitting laser (VCSEL) comprising:
   a substrate;
   a lower reflector formed on the substrate;
   an active layer formed on the lower reflector, generating light by a recombination of electrons and holes;
   an upper reflector formed on the active layer comprising a lower reflectivity than that of the lower reflector;
   a micro-lens disposed in a window region and comprising a single convex surface having an arch extending through the entire window region through which the laser beam is emitted to collimate the laser beam across the entire window region;
   a lens layer formed on the upper reflector with a transparent material transmitting a laser beam, the lens layer comprising the micro-lens;
   an upper electrode formed above the upper reflector excluding the window region; and
   a lower electrode formed underneath the substrate, wherein the VCSEL satisfies the relationship:

$$f = R \times n1 / (n2 - n1)$$

where f is a distance along an optical axis from a light generating region of the active layer to a vertex of the micro-lens, R is a radius of curvature of the micro-lens, n1 is an effective refractive index of a medium on an optical path between the light generating region and the lens layer, and n2 is a refractive index of a region towards which a light is emitted through the micro-lens.

2. The micro-lens built-in VCSEL as recited in claim 1, further comprising a high-resistance region between the upper and lower reflectors relatively close to the active layer, the high-resistance region having an aperture at a center thereof through which a current flows.

3. The micro-lens built-in VCSEL as recited in claim 1, wherein the lens layer is formed of a material comprising at least one of silicon and a III–V compound semiconductor, wherein the III–V compound semiconductor comprises one of indium phosphide (InP), gallium arsenide (GaAs), indium arsenide (InAs), gallium phosphide (GaP), indium gallium phosphide (InGaP), indium gallium arsenide (InGaAs), and aluminum gallium arsenide (AlGaAs), the material comprising a relatively large bandgap to a wavelength of the laser beam so as not to absorb the laser beam.

4. The micro-lens built-in VCSEL as recited in claim 3, wherein the lens layer is formed of a material comprising at least one of silicon and a III–V compound semiconductor, wherein the III–V compound semiconductor comprises one of indium phosphide (InP), gallium arsenide (GaAs), indium arsenide (InAs), gallium phosphide (GaP), indium gallium phosphide (InGaP), indium gallium arsenide (InGaAs), and aluminum gallium arsenide (AlGaAs), the material comprising a relatively large bandgap to a wavelength of the laser beam so as not to absorb the laser beam.

5. The micro-lens built-in VCSEL as recited in claim 3, wherein the micro-lens is formed by diffusion-limited etching.

6. The micro-lens built-in VCSEL as recited in claim 1, wherein the micro-lens is formed by diffusion-limited etching.

7. A micro-lens built-in vertical cavity surface emitting laser (VCSEL) comprising:
   a substrate;
   a lower reflector formed on the substrate;
   an active layer formed on the lower reflector generating light by a recombination of electrons and holes;
   an upper reflector formed on the active layer comprising a lower reflectivity than that of the lower reflector;
   a micro-lens disposed in a window region through which the laser beam is emitted to collimate the laser beam across the entire window region, wherein the micro-lens comprises an arch extending through the entire window region;
a lens layer formed on the upper reflector with a transparent material transmitting a laser beam, the lens layer comprising the micro-lens
an upper electrode formed above the upper reflector excluding the window region; and
a lower electrode formed underneath the substrate,
wherein the window region comprises a maximum width smaller than a size of light generated in the active layer emitted towards the window region, satisfying a Fraunhofer diffraction condition, where the Fraunhofer diffraction condition occurring in the window region is offset by a focusing power of the micro-lens, wherein the maximum width of the window region D and a focal length f of the micro-lens satisfy the relation:

$$D = \sqrt{2 \times 1.22 \lambda f}$$

where λ is a wavelength of the laser beam emitted from the VCSEL.

8. The micro-lens built-in VCSEL as recited in claim 7, further comprising a high-resistance region between the upper and lower reflectors, relatively close to the active layer, the high-resistance region comprising an aperture at a center thereof through which a current flows, the aperture of the high-resistance region comprising a maximum width greater than or approximately equal to the maximum width of the window region.

9. The micro-lens built-in VCSEL as recited in claim 7, further comprising a high-resistance region between the upper and lower reflectors, relatively close to the active layer, the high-resistance region comprising an aperture at a center thereof through which a current flows, the aperture of the high-resistance region comprising a maximum width greater than or approximately equal to the maximum width of the window region.

10. A micro-lens built-in vertical cavity surface emitting laser (VCSEL) comprising:
a micro-lens disposed in a window region and comprising a single convex surface having an arch extending through the entire window region through which a laser beam is emitted to collimate the laser beam across the entire window region;
a substrate comprising a transparent material transmitting the laser beam, the substrate comprising the micro-lens;
a lower reflector formed on the substrate;
an active layer formed on the lower reflector, generating light by recombination of electrons and holes;
an upper reflector formed on the active layer comprising a higher reflectivity than that of the lower reflector;
an upper electrode formed on the upper reflector; and
a lower electrode formed on a portion of the substrate excluding the window region through which the laser beam is emitted, wherein the VCSEL satisfies the relationship:

$$f = R \times n1/(n2 - n1)$$

where f is a distance along an optical axis from a light generating region of the active layer to a vertex of the micro-lens, R is a radius of curvature of the micro-lens, n1 is an effective refractive index of a medium on an optical path between the light generating region and the lens layer, and n2 is a refractive index of a region towards which a light is emitted through the micro-lens.

11. The micro-lens built-in VCSEL as recited in claim 10, further comprising a high-resistance region between the upper and lower reflectors relatively close to the active layer, the high-resistance region having an aperture at a center thereof through which a current flows.

12. The micro-lens built-in VCSEL as recited in claim 10, wherein the lens layer is formed of a material comprising at least one of silicon and a III–V compound semiconductor, wherein the III–V compound semiconductor comprises one of indium phosphide (InP), gallium arsenide (GaAs), indium arsenide (InAs), gallium phosphide (GaP), indium gallium phosphide (InGaP), indium gallium arsenide (InGaAs), and aluminum gallium arsenide (AlGaAs), the material comprising a relatively large bandgap to a wavelength of the laser beam so as not to absorb the laser beam.

13. The micro-lens built-in VCSEL as recited in claim 10, wherein the micro-lens is formed by diffusion-limited etching.

14. A micro-lens built-in vertical cavity surface emitting laser (VCSEL) comprising:
a micro-lens disposed in a window region through which a laser beam is emitted to collimate the laser beam across the entire window region, wherein the micro-lens comprises an arch extending through the entire window region;
a substrate comprising a transparent material transmitting the laser beam, the substrate comprising the micro-lens;
a lower reflector formed on the substrate;
an active layer formed on the lower reflector, generating light by recombination of electrons and holes;
an upper reflector formed on the active layer comprising a higher reflectivity than that of the lower reflector;
an upper electrode formed on the upper reflector; and
a lower electrode formed on a portion of the substrate excluding the window region through which the laser beam is emitted,
wherein the window region comprises a maximum width smaller than a size of the light generated in the active layer and emitted towards the window region, satisfying a Fraunhofer diffraction condition, where the Fraunhofer diffraction condition occurring in the window region is offset by a focusing power of the micro-lens, wherein the maximum width of the window region D and a focal length f of the micro-lens satisfy a relation:

$$D = \sqrt{2 \times 1.22 \lambda f}$$

where λ is a wavelength of the laser beam emitted from the VCSEL.

15. The micro-lens built-in VCSEL as recited in claim 14, further comprising a high-resistance region between the upper and lower reflectors positioned relatively close to the active layer, the high-resistance region comprising an aperture at a center thereof through which a current flows, where the aperture of the high-resistance region comprises a maximum width greater than or approximately equal to the maximum width of the window region.

16. The micro-lens built-in VCSEL as recited in claim 14, further comprising a high-resistance region between the upper and lower reflectors positioned relatively close to the active layer, the high-resistance region comprising an aperture at a center thereof through which a current flows, where the aperture of the high-resistance region comprises a maximum width greater than or approximately equal to the maximum width of the window region.

17. The micro-lens built-in VCSEL as recited in claim 14, wherein the lens layer is formed of a material comprising at least one of silicon and a III–V compound semiconductor, wherein the III–V compound semiconductor comprises one of indium phosphide (InP), gallium arsenide (GaAs), indium arsenide (InAs), gallium phosphide (GaP), indium gallium phosphide (InGaP), indium gallium arsenide (InGaAs), and aluminum gallium arsenide (AlGaAs), the material comprising a relatively large bandgap to a wavelength of the laser beam so as not to absorb the laser beam.

18. The micro-lens built-in VCSEL as recited in claim 14, wherein the micro-lens is formed by diffusion-limited etching.

19. A micro-lens built-in vertical cavity surface emitting laser (VCSEL), comprising:
    a micro-lens integrally formed on a laser beam emitting surface of the VCSEL and comprising a single convex surface disposed in a window region through which a light beam is emitted to collimate the light beam across a window region to emit a parallel light beam, wherein the single convex surface comprises an arch extending through the entire window region;
    a lens layer comprising the micro-lens and formed on the laser beam emitting surface of the VCSEL; and
    an upper electrode formed on a portion of the lens layer excluding the window region, wherein the VCSEL satisfies the relationship:

$f=R \times n1/(n2-n1)$ where f is a distance along an optical axis from a source of the light beam to a vertex of the micro-lens, R is a radius of curvature of the micro-lens, n1 is an effective refractive index of a medium on an optical path between the light beam source and the lens layer, and n2 is a refractive index of a region towards which a light is emitted through the micro-lens.

20. The micro-lens built-in VCSEL as recited in claim 19, further comprising:
    a substrate;
    a lower electrode formed underneath the substrate;
    a lower reflector;
    an active layer comprising a light generating region; and
    an upper reflector comprising a relatively lower reflectivity than that of the lower reflector, wherein the window region is defined by the upper electrode and the micro-lens.

21. The micro-lens built-in VCSEL as recited in claim 20, wherein the first focal point of the micro-lens is positioned in the light generating region of the active layer, so that the light beam generated in a narrow light generating region is incident on and condensed by the micro-lens, and is emitted as the parallel light beam.

22. The micro-lens built-in VCSEL as recited in claim 20, further comprising:
    a high-resistance region between the upper and lower reflectors relatively close to the active layer, the high-resistance region having an aperture at a center thereof through which a current flows comprising a maximum width greater than or approximately equal to the maximum width of the window region.

23. The micro-lens built-in VCSEL as recited in claim 22, wherein the aperture is small where the current applied through the upper electrode passes a region on the active layer and the light beam is generated in a dot-sized region of the active layer.

24. The micro-lens built-in VCSEL as recited in claim 20, wherein the lower reflector, the active layer, and the upper reflector are sequentially stacked on the substrate.

25. The micro-lens built-in VCSEL as recited in claim 20, wherein the substrate is formed of a semiconductor material comprising n-doped gallium arsenide (GaAs), aluminum gallium arsenide (AlGaAs), indium arsenide (InAs), indium phosphide (InP), gallium phosphide (GaP), indium gallium phosphide (InGaP), indium gallium arsenide (InGaAs), or gallium phosphide (GaP), the material comprising a relatively large bandgap to a wavelength of the laser beam so as not to absorb the laser beam.

26. The micro-lens built-in VCSEL as recited in claim 20, wherein the lower reflector and the upper reflector are formed of alternating semiconductor compounds comprising different refractive indexes.

27. The micro-lens built-in VCSEL as recited in claim 20, wherein the substrate is doped with n-type impurities, the lower reflector is doped with the same n-type impurities and the upper reflector is doped with p-type impurities.

28. The micro-lens built-in VCSEL as recited in claim 20, wherein the active layer is formed of GaAs, AlGaAs, InGaAs, InGaP and/or AlGaAsP according to a wavelength of the light beam.

29. The micro-lens built-in VCSEL as recited in claim 20, further comprising:
    a high-resistance region comprising an aperture at a center thereof through which current applied through the upper electrode flows and high-resistance region is formed by implantations of ions or by selective oxidation in a region of the upper reflector.

30. The micro-lens built-in VCSEL as recited in claim 20, wherein the lens layer comprises a thickness of several micrometers and is formed of a material having a relatively wide bandgap to a wavelength of the light beam generated from the VCSEL.

31. The micro-lens built-in VCSEL as recited in claim 20, wherein the upper electrode is formed on the lens layer or between the upper reflector and the lens layer.

32. The micro-lens built in VCSEL as recited in claim 20, wherein as a forward biased current is applied to the micro-lens built-in VCSEL through the upper and lower electrodes, the light beam comprising a particular wavelength through laser oscillation is transmitted through the upper reflector and the lens layer and is condensed by the micro-lens and emitted as the parallel laser beam.

33. The micro-lens built-in VCSEL as recited in claim 19, wherein the micro-lens lies along a central optical axis of the light beam emitted from the VCSEL.

34. The micro-lens built-in VCSEL as recited in claim 19, wherein the convex surface is formed by diffusion-limited etching.

35. The micro-lens built in VCSEL as recited in claim 19, wherein the VCSEL is a top-emitting type VCSEL.

36. The micro-lens built-in VCSEL as recited in claim 19, further comprising:
    a substrate, wherein the micro-lens is formed in the window region of the substrate through which the light beam is condensed and emitted;
    a lower reflector;
    an active layer comprising a light generating region;
    an upper reflector comprising a higher reflectivity than that of the lower reflector;

a lower electrode formed underneath the substrate excluding a window region through which the light beam is emitted; and an upper electrode formed on the upper reflector, wherein the window region is defined by the lower electrode and the micro-lens.

37. The micro-lens built-in VCSEL as recited in claim 36, wherein a first focal point of the micro-lens is positioned in the light generating region of the active layer, where the light beam generated in a narrow light generating region is incident on and condensed by the micro-lens, and is emitted as the parallel light beam.

38. The micro-lens built-in VCSEL as recited in claim 36, further comprising:

a high-resistance region between the upper and lower reflectors relatively close to the active layer, the high-resistance region comprising an aperture at a center thereof through which a current flows comprising a maximum width greater than or approximately equal to the maximum width of the window region.

39. The micro-lens built-in VCSEL as recited in claim 36, wherein the lower reflector, the active layer, and the upper reflector are sequentially stacked on the substrate.

40. The micro-lens built-in VCSEL as recited in claim 36, wherein when a number of stacked layers of the lower reflector is smaller than that of the upper reflector, the reflectivity of the lower reflector is lower than that of the upper reflector and most of the laser beam is emitted through the lower reflector.

41. The micro-lens built-in VCSEL as recited in claim 36, wherein the substrate is formed of a semiconductor material comprising n-doped gallium arsenide (GaAs), aluminum gallium arsenide (AlGaAs), indium arsenide (InAs), indium phosphide (InP), gallium phosphide (GaP), indium gallium phosphide (InGaP), indium gallium arsenide (InGaAs), or gallium phosphide (GaP).

42. The micro-lens built-in VCSEL as recited in claim 36, wherein the lower reflector and the upper reflector are formed of alternating semiconductor compounds comprising different refractive indexes.

43. The micro-lens built-in VCSEL as recited in claim 36, wherein the substrate comprises a material having a relatively wide bandgap compared to a wavelength of the light beam generated from the VCSEL, so as not to absorb, but transmit the laser beam incident from the lower reflector.

44. The micro-lens built in VCSEL as recited in claim 36, wherein as a forward biased current is applied to the micro-lens built-in VCSEL through the upper and lower electrodes, a laser beam comprising a particular wavelength through laser oscillation is transmitted through the lower reflector and the substrate and is condensed by the micro-lens and emitted as the parallel laser beam.

45. The micro-lens built in VCSEL as recited in claim 36, wherein the VCSEL is a bottom-emitting type VCSEL.

46. The micro-lens built in VCSEL as recited in claim 23, further comprising:

a substrate;
a lower electrode formed underneath the substrate;
a lower reflector;
an active layer comprising a light generating region; and
an upper reflector comprising a relatively lower reflectivity than that of the lower reflector, wherein the window region comprises a diameter satisfying a Fraunhofer diffraction condition and is defined by the upper electrode and the micro-lens.

47. The micro-lens built in VCSEL as recited in claim 46, wherein the window region comprises a maximum width smaller than a size of the light beam generated in the active layer emitted towards the window region.

48. The micro-lens built in VCSEL as recited in claim 46, wherein the Fraunhofer diffraction condition of the window is offset by a focusing power of the micro-lens so that a parallel laser beam is emitted through the micro-lens.

49. The micro-lens built in VCSEL as recited in claim 46, further comprising a high-resistance region between the upper and lower reflectors relatively close to the active layer, the high-resistance region comprises an aperture at the center thereof through which a current flows.

50. The micro-lens built in VCSEL as recited in claim 49, wherein the diameter of the window is smaller than or approximately equal to a diameter of the aperture of the high-resistance region.

51. The micro-lens built in VCSEL as recited in claim 46, wherein the window and the micro-lens are positioned on a same plane.

52. The micro-lens built in VCSEL as recited in claim 46, wherein the micro-lens is positioned in front or behind the window or the micro-lens and the window are positioned on a same plane.

53. The micro-lens built in VCSEL as recited in claim 46, wherein the VCSEL is a top-emitting type VCSEL.

54. A micro-lens built-in vertical cavity surface emitting laser (VCSEL), comprising:

a micro-lens integrally formed on a laser beam emitting surface of the VCSEL and comprising a single convex surface disposed in a window region through which a light beam is emitted to collimate the light beam across a window region to emit a parallel light beam, wherein the single convex surface comprises an arch extending through the entire window region;

a lens layer comprising the micro-lens and formed on the laser beam emitting surface of the VCSEL;

an upper electrode formed on a portion of the lens layer excluding the window region;

a substrate;

a lower electrode formed underneath the substrate;

a lower reflector;

an active layer comprising a light generating region; and an upper reflector comprising a relatively lower reflectivity than that of the lower reflector, wherein the window region is defined by the upper electrode and the micro-lens, wherein a distance along an optical axis from the light generating region to a vertex of the micro-lens is equal to a focal length of the micro-lens, and wherein the VCSEL satisfies a following relationship:

$$f = R \times n1/(n2-n1)$$

where f is a distance along an optical axis from the light generating region to the vertex of the micro-lens, R is a radius of curvature of the micro-lens, n1 is an effective refractive index of a medium on an optical path between the light generating region and the lens layer, and n2 is a refractive index of a region toward which the light beam is emitted through the micro-lens.

55. A micro-lens built-in vertical cavity surface emitting laser (VCSEL), comprising:

a micro-lens integrally formed on a laser beam emitting surface of the VCSEL and comprising a single convex surface disposed in a window region through which a light beam is emitted to collimate the light beam across a window region to emit a parallel light beam, wherein the single convex surface comprises an arch extending through the entire window region;

a lens layer comprising the micro-lens and formed on the laser beam emitting surface of the VCSEL;

an upper electrode formed on a portion of the lens layer excluding the window region;

a substrate;

a lower electrode formed underneath the substrate;

a lower reflector;

an active layer comprising a light generating region; and an upper reflector comprising a relatively lower reflectivity than that of the lower reflector, wherein the window region is defined by the upper electrode and the micro-lens, wherein a distance along an optical axis from the light generating region to a vertex of the micro-lens is equal to a focal length of the micro-lens, and wherein the VCSEL satisfies a following relationship:

$$n1/S1 = n2/S2 = (n2-n1)/R$$

where S1 is a distance from the light generating region of the active layer to a vertex of the micro-lens on the optical axis, S2 is a distance from the vertex of the micro-lens to a second focal point of the micro-lens, n1 is an effective refractive index of the medium from the upper reflector and the lens layer, and n2 is a refractive index of a region toward which the light beam emitted through the micro-lens travels.

56. A micro-lens built-in vertical cavity surface emitting laser (VCSEL), comprising:

a micro-lens integrally formed on a laser beam emitting surface of the VCSEL and comprising a single convex surface disposed in a window region through which a light beam is emitted to collimate the light beam across a window region to emit a parallel light beam, wherein the single convex surface comprises an arch extending through the entire window region;

a lens layer comprising the micro-lens and formed on the laser beam emitting surface of the VCSEL;

an upper electrode formed on a portion of the lens layer excluding the window region;

a substrate, wherein the micro-lens is formed in the window region of the substrate through which the light beam is condensed and emitted;

a lower reflector;

an active layer comprising a light generating region;

an upper reflector comprising a higher reflectivity than that of the lower reflector;

a lower electrode formed underneath the substrate excluding a window region through which the light beam is emitted; and an upper electrode formed on the upper reflector, wherein the window region is defined by the lower electrode and the micro-lens, wherein the VCSEL satisfies a following relationship:

$$f' = R' \times n1'/(n2'-n1')$$

where R' is a radius of curvature of the micro-lens, n1' is a effective refractive index of a medium along an optical path between the light generating region of the active layer and the micro-lens, and n2' is a refractive index of a region toward which the light beam emits through the micro-lens, f' is a distance from the light generating region to a vertex of the micro-lens along the optical axis.

57. A micro-lens built-in vertical cavity surface emitting laser (VCSEL), comprising:

a micro-lens integrally formed on a laser beam emitting surface of the VCSEL and comprising a single convex surface disposed in a window region through which a light beam is emitted to collimate the light beam across a window region to emit a parallel light beam, wherein the single convex surface comprises an arch extending through the entire window region;

a lens layer comprising the micro-lens and formed on the laser beam emitting surface of the VCSEL;

an upper electrode formed on a portion of the lens layer excluding the window region;

a substrate;

a lower electrode formed underneath the substrate;

a lower reflector;

an active layer comprising a light generating region; and an upper reflector comprising a relatively lower reflectivity than that of the lower reflector, wherein the window region comprises a diameter satisfying a Fraunhofer diffraction condition and is defined by the upper electrode and the micro-lens, wherein the Fraunhofer diffraction condition of the window is offset by a focusing power of the micro-lens so that a parallel laser beam is emitted through the micro-lens, and wherein the diameter D of the window and a focal length f of the micro-lens satisfy a following relationship:

$$D = \sqrt{2 \times 1.22 \lambda f}$$

where λ is a wavelength of the light beam emitted from the VCSEL.

58. A micro-lens built-in vertical cavity surface emitting laser (VCSEL), comprising:

a micro-lens integrally formed on a laser beam emitting surface of the VCSEL and comprising a single convex surface disposed in a window region through which a light beam is emitted to collimate the light beam across a window region to emit a parallel light beam, wherein the single convex surface comprises an arch extending through the entire window region;

a lens layer comprising the micro-lens and formed on the laser beam emitting surface of the VCSEL;

an upper electrode formed on a portion of the lens layer excluding the window region;

a substrate;

a lower electrode formed underneath the substrate;

a lower reflector;

an active layer comprising a light generating region; and an upper reflector comprising a relatively lower reflectivity than that of the lower reflector, wherein the window region comprises a diameter satisfying a Fraunhofer diffraction condition and is defined by the upper electrode and the micro-lens, wherein the Fraunhofer diffraction condition satisfies a following relationship:

$$N_f = \frac{D^2}{\lambda d} << 1$$

where $N_f$ is a Fresnel number, λ is a wavelength of the light beam emitted from the VCSEL, D is the diameter of the window, and d is a distance from the window to an observing plane, which is one focal point of the micro-lens.

59. A micro-lens built-in vertical cavity surface emitting laser (VCSEL), comprising:

a micro-lens integrally formed on a laser beam emitting surface of the VCSEL and comprising a single convex surface disposed in a window region through which a light beam is emitted to collimate the light beam across a window region to emit a parallel light beam, wherein the single convex surface comprises an arch extending through the entire window region;

a lens layer comprising the micro-lens and formed on the laser beam emitting surface of the VCSEL;

an upper electrode formed on a portion of the lens layer excluding the window region;

a substrate;

a lower electrode formed underneath the substrate;

a lower reflector;

an active layer comprising a light generating region; and an upper reflector comprising a relatively lower reflectivity than that of the lower reflector, wherein the window region comprises a diameter satisfying a Fraunhofer diffraction condition and is defined by the upper electrode and the micro-lens, wherein when the micro-lens and the window are positioned on a same plane and only a $0^{th}$-order diffracted beam comprising a high intensity is considered, a radius $R_s$ of the $0^{th}$-order diffracted beam satisfies a following relationship:

$$R_s = \frac{1.22\lambda d}{D}$$

where $\lambda$ is a wavelength of the light beam emitted from the VCSEL, D is the diameter of the window, and d is a distance from the window to an observing plane.

* * * * *

UNITED STATES PATENT AND TRADEMARK OFFICE
CERTIFICATE OF CORRECTION

PATENT NO. : 7,294,863 B2
APPLICATION NO. : 09/982086
DATED : November 13, 2007
INVENTOR(S) : Jeong-kwan Lee et al.

It is certified that error appears in the above-identified patent and that said Letters Patent is hereby corrected as shown below:

Column 13, line 6, insert --;-- after "micro-lens".

Column 19, line 19, change "$n1/S1=n2/S2=(n2-n1)/R$" to --$n1/S1+n2/S2=(n2-n1)/R$--.

Signed and Sealed this

Eighteenth Day of March, 2008

JON W. DUDAS
*Director of the United States Patent and Trademark Office*